United States Patent
Cauchy et al.

[19]

[11] Patent Number: 6,103,967
[45] Date of Patent: Aug. 15, 2000

[54] THERMOELECTRIC MODULE AND METHOD OF MANUFACTURING THE SAME

[75] Inventors: Charles J. Cauchy; Larry W. Wertenberger, both of Traverse City, Mich.

[73] Assignee: Tellurex Corporation, Traverse City, Mich.

[21] Appl. No.: 09/106,637

[22] Filed: Jun. 29, 1998

[51] Int. Cl.$^7$ .................................................. H01L 35/00
[52] U.S. Cl. .................... 136/201; 136/203; 136/205; 136/237
[58] Field of Search ..................... 136/203, 205, 136/201, 237, 239, 240; 252/62.3 T

[56] References Cited

U.S. PATENT DOCUMENTS

| | | | |
|---|---|---|---|
| 3,079,455 | 2/1963 | Haba | 136/237 |
| 4,885,810 | 12/1989 | Gelb et al. | 357/87 |
| 5,429,680 | 7/1995 | Fuschetti | 136/203 |
| 5,441,576 | 8/1995 | Bierschenk et al. | 136/203 |
| 5,448,109 | 9/1995 | Cauchy | 257/719 |
| 5,817,188 | 10/1998 | Yahatz et al. | 136/237 |

FOREIGN PATENT DOCUMENTS 138743   11/1979   Germany.

*Primary Examiner*—Kathryn Gorgos
*Assistant Examiner*—Thomas H Parsons
*Attorney, Agent, or Firm*—Flynn, Thiel, Boutell & Tanis, P.C.

[57] ABSTRACT

A thermoelectric module contains a P-type semiconductor element and an N-type semiconductor element electrically connected in series to each other in a circuit containing a conductor and a solder layer. The solder is formed from a ternary eutectic alloy composition containing bismuth in an amount of from 5 to 70 atomic %, tin in an amount of from 20 to 70 atomic % and antimony in an amount of from 5 to 70 atomic %. The solder composition provides the thermoelectric module with improved high temperature performance and enables the semiconductor elements to be directly contacted with the soldering layer without the necessity of a barrier layer.

30 Claims, 3 Drawing Sheets

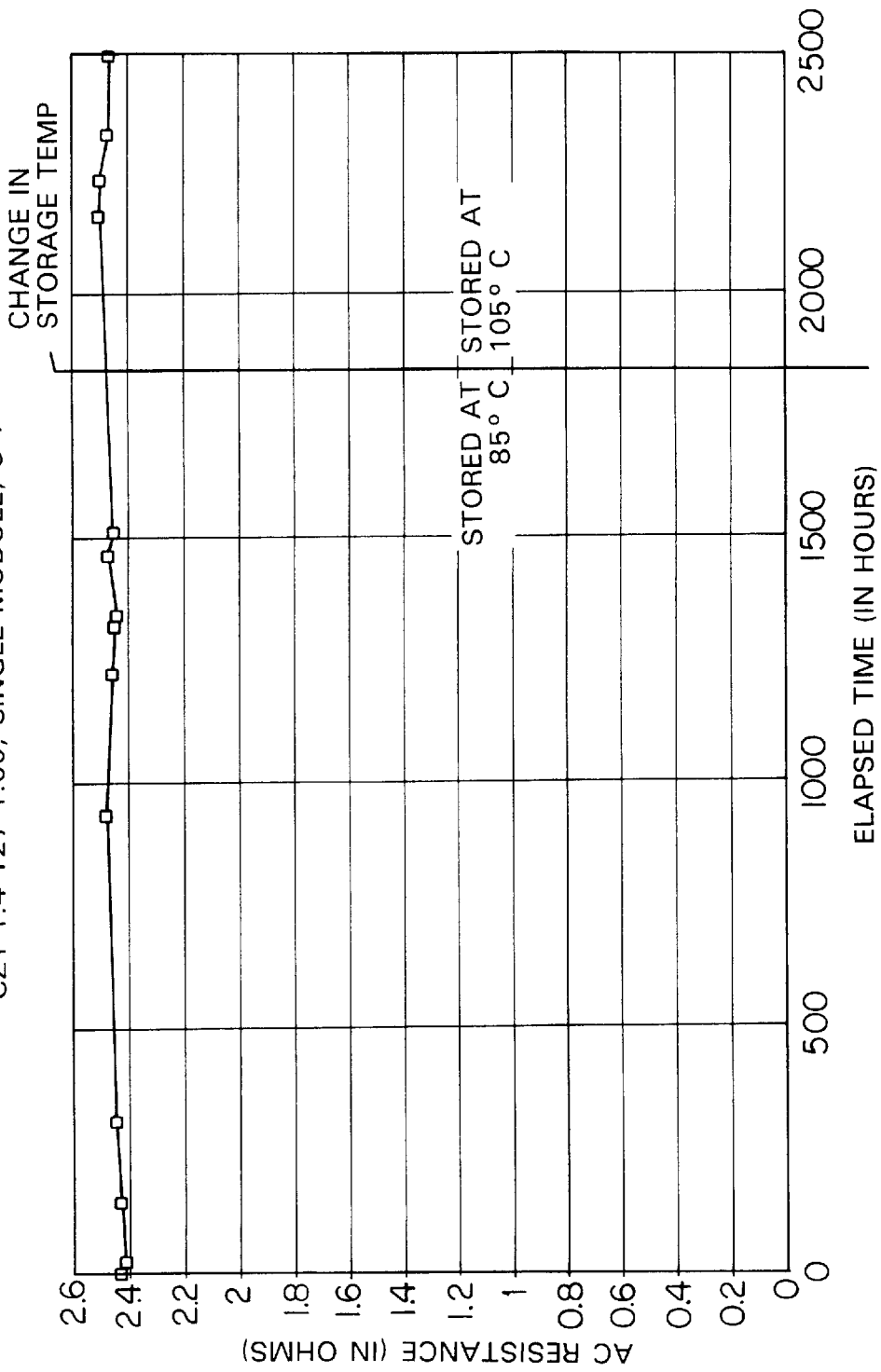

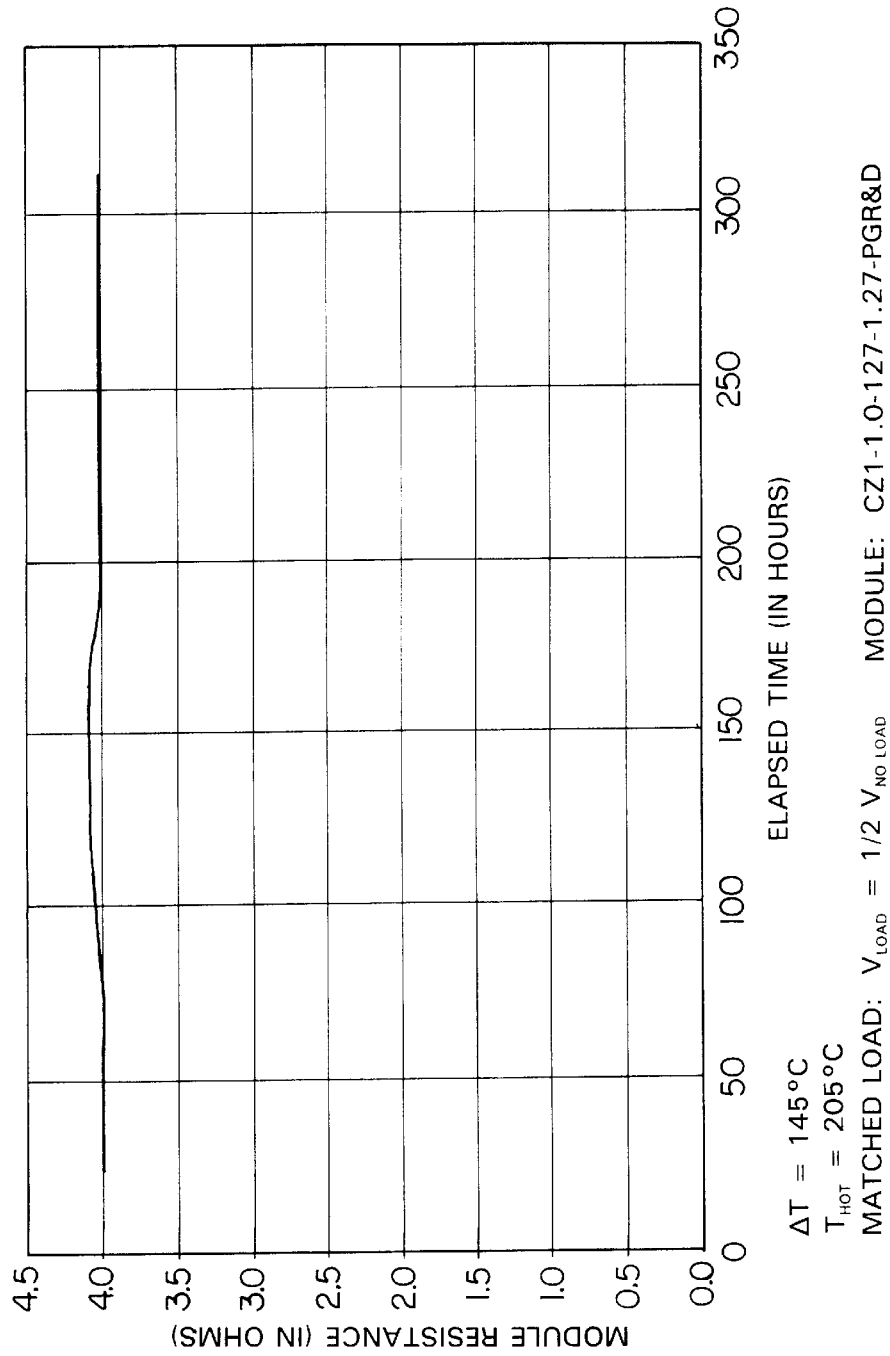

THERMOELECTRIC MODULE AND METHOD OF MANUFACTURING THE SAME

BACKGROUND OF THE INVENTION

1. Field of the Invention

The present invention relates generally to an improved thermoelectric module which exhibits superior high temperature performance characteristics and mechanical strength and a method of producing the thermoelectric module.

2. Description of the Related Art

Thermoelectric modules are solid-state devices which are used as either heat pumps or electrical power generators and have found applications in waste heat recovery and temperature control. In an open circuit mode, the thermoelectric module acts like a thermocouple and if a temperature gradient is maintained across the module, an electrical potential results across its terminals which is a function of the temperature difference. On the other hand, if the thermoelectric module is connected to a DC power source, heat will be absorbed at one end of the device, cooling it, while heat is rejected at the other end, where the temperature rises.

Thermoelectric modules are formed from P-type semiconductor elements and N-type semiconductor elements electrically connected in series and the modules are arranged thermally in parallel during use. The semiconductor elements typically are soldered to conductors using different types of solder compositions. Haba, U.S. Pat. No. 3,079,455, discloses a low temperature solder composition formed of tin, antimony and bismuth with the bismuth being provided therein in an amount of from 40 to 50 weight % and the antimony being present in an amount of from 1.5 to 3.5 weight %.

WO 97/13283 discloses a solder composition used in the formation of thermoelectric modules which contains about 50 to 99 weight % bismuth and about 50 to 1 weight % antimony and further discloses that bismuth-tin solder compositions, such as disclosed in U.S. Pat. No. 3,079,455, are not serviceable at temperatures substantially above 80° C. because the tin in the solder tends to diffuse rapidly into the semiconductor elements and into the crystal lattice of the semiconductor elements to act as a dopant or react with the material of the semiconductor elements and that the tin also forms a film over the surface of the material adjacent to the soldered ends where it acts as a resistor across the elements and causes a voltage drop and/or a short. This reference further discloses that Gelb et al, U.S. Pat. No. 4,855,810, sought to overcome the problems of tin diffusion and resistor formation by replacing the tin-based solder with a lead-antimony solder composition but that at elevated temperatures, the lead also diffused and reacted with the thermoelectric semiconductor material to form a region of poor thermoelectric performance.

SUMMARY OF THE INVENTION

An object of the present invention is to provide a thermoelectric module which utilizes a bismuth-tin-antimony ternary eutectic alloy having a high melting point as a solder.

Another object of the present invention is to provide a thermoelectric module which utilizes a bismuth-tin-antimony solder composition as a solder which does not contaminate the semiconductor elements.

A further object of the present invention is to provide a thermoelectric module utilizing a bismuth-tin-antimony solder composition which does not produce an appreciable resistance increase during extended use at high temperatures.

A still further object of the present invention is to provide a thermoelectric module which utilizes a bismuth-tin-antimony solder composition and does not require the provision of a barrier layer between the solder composition and the semiconductor elements.

Another object of the present invention is to provide a method of fabricating the thermoelectric module described above.

These and other objects of the present invention are attained by providing a thermoelectric module made up of conductors comprising a connecting conductor, second and third conductors, a metallized layer formed on a surface of the conductors next to a solder layer and a P-type semiconductor element and an N-type semiconductor element electrically connected in a series to each other through the conductors and the solder layer, which is formed from a ternary eutectic alloy composition containing bismuth in an amount of from 5 to 70 atomic %, tin in an amount of from 20 to 80 atomic % and antimony in an amount of from 5 to 70 atomic %.

BRIEF DESCRIPTION OF THE DRAWINGS

FIG. 2 is a graph illustrating the module resistance versus elapsed time for a thermoelectric module according to the present invention; and FIG. 3 is a graph illustrating the AC resistance versus elapsed time for another thermoelectric module according to the present invention.

DESCRIPTION OF THE PREFERRED EMBODIMENT

Figure 1:
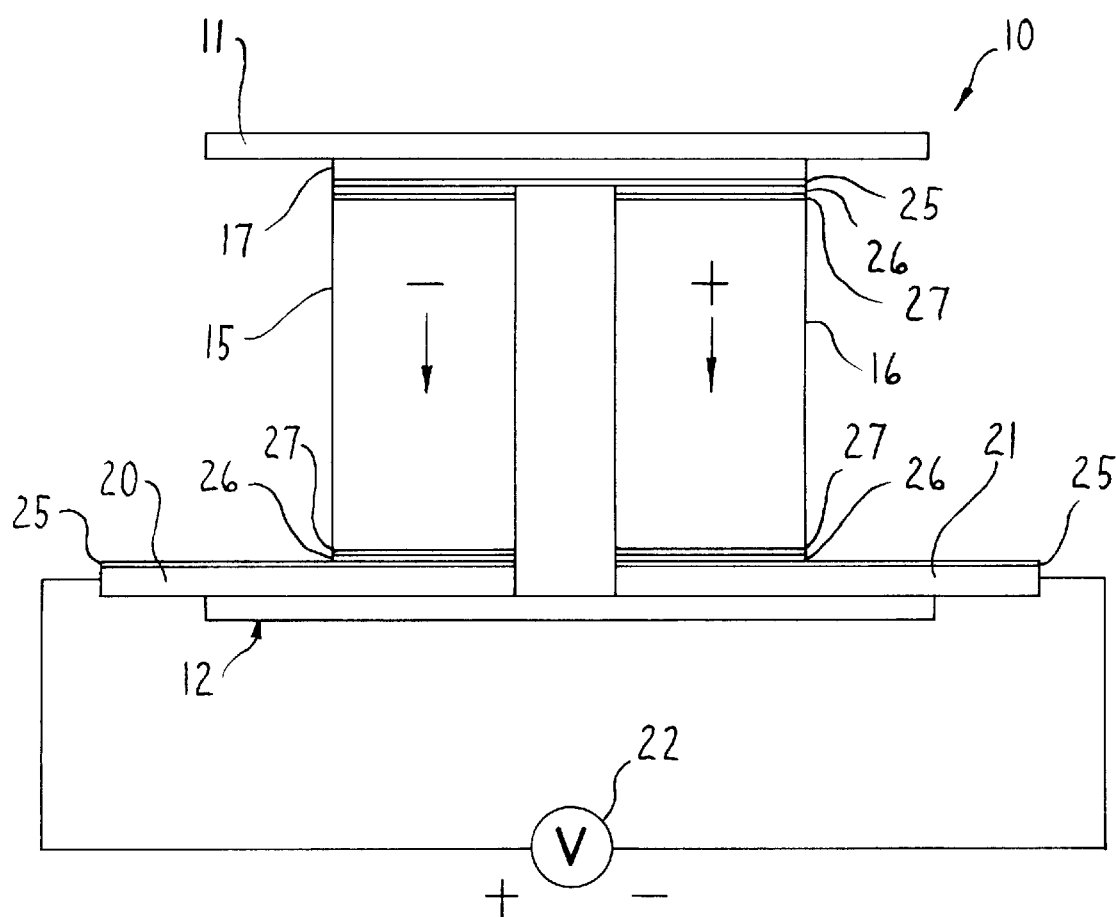
FIG. 1 illustrates the construction of a thermoelectric module.

As illustrated in FIG. 1, a heat pump 10 incorporating a thermoelectric module according to the present invention comprises an upper ceramic substrate 11 and a lower ceramic substrate 12. The upper surface of the upper ceramic substrate 11 is placed into contact with the surface of the object to be cooled and the lower surface of the lower ceramic substrate 12 is placed in contact with a heat sink to dissipate the absorbed heat. An N-type semiconductor element 15 and a P-type semiconductor element 16 are connected in series and provided between the upper ceramic substrate 11 and the lower ceramic substrate 12. A connecting conductor 17 is provided on the under side of the upper ceramic substrate 11 and a metallized layer 25 is provided underneath the connecting conductor 17. A barrier layer 27 may be provided on the top and bottom surfaces of the semiconductor elements 15, 16 and a solder layer 26 is provided between the barrier layer 27 and the metallized layer 25 in order to electrically connect and secure the semiconductor elements 15, 16 to the connecting conductor 17. A second electrical conductor 20 is provided on a portion of the upper surface of the lower ceramic substrate in electrical connection with the lower end of the N-type semiconductor element 15 and a third electrical conductor 21 is provided on another portion of the upper surface of the lower ceramic substrate 12 in electrical connection with the lower end of the P-type semiconductor element 16. A metallized layer 25 is provided on the top surfaces of the second and third conductors 20, 21 and a solder layer 26 is provided between the metallized layer 25 and the barrier layer 27. A direct current source 22 is provided with a positive terminal electrically connected with the second conductor 20 and a negative terminal electrically connected with the third conductor 21.

Many conventionally available N-type and P-type semiconductor elements can be used in the present invention. The preferred N-type semiconductor material is of the bismuth-telluride family and may contain bismuth, tellurium, selenium and, optionally, antimony. The P-type semiconductor material preferably contains bismuth, antimony and tellurium. In a specially preferred embodiment, the P-type semiconductor material is pressed and sintered and the N-type semiconductor material is crystalline. Preparation of the pressed and sintered P-type semiconductor material and crystalline N-type semiconductor material is shown in U.S. Pat. No. 5,448,109 and the disclosure of this patent is expressly incorporated by reference herein.

The conductors 11, 20 and 21 are typically made of a conductive metal such as copper. The metallized layer 25 provided on the surfaces of the conductors helps prevent the migration of mobile atoms from the conductors into the semiconductor elements 15, 16. The metallized layer typically is made of nickel and also can contain phosphorous or boron in a small amount.

In order to prevent contamination of the semiconductor elements 15, 16 from the solder 26, a barrier layer 27 is typically provided on the surfaces of the semiconductor elements 15, 16. As with the metallized layer 25, the barrier layer 27 typically is made of nickel and can contain a small percentage of phosphorous or boron.

As discussed above, the solder layer 26 of the present invention is formed from a ternary eutectic alloy composition containing bismuth in an amount of from 5 to 70 atomic %, tin in an amount of from 20 to 80 atomic % and antimony in an amount of from 5 to 70 atomic %. A preferred range of content of the components of the solder is bismuth in an amount of from 10 to 70 atomic %, tin in an amount of from 20 to 40 atomic % and antimony in an amount of from 10 to 70 atomic %. An especially preferred solder composition contains bismuth in an amount of from 20 to 70 atomic %, tin in an amount of from 20 to 40 atomic % and antimony in an amount of from 10 to 40 atomic %.

The following Examples illustrate embodiments of the present invention.

EXAMPLE 1

In FIG. 2, a graph is presented in which the module resistance for a thermoelectric module according to the present invention is measured over time. The thermoelectric module was formed from 127 thermoelectric couples, 254 pellets and 508 solder junctions, all electrically connected in series. The pellets were 1.4 mm×1.4 mm×1.65 mm tall. The thermoelectric material for the P-type semiconductor element was pressed and sintered $Bi_{12}Sb_{23}Te_{65}$ and the N-type semiconductor material was crystalline $(Bi_2Te_3)_{90}(Sb_2Te_3)_5(Sb_2Se_3)_5$ doped with 0.05 atomic % iodine compounded with bismuth.

This test was performed to evaluate the effect of the solder on the thermoelectric material and conducted in free air, which is a harsh oxidizing environment. As shown in the graph, the AC resistance of the module was very stable over the test period and showed less than a 4% variation between the highest and lowest readings. Since some of this variation is probably attributable to test noise, the actual variation is probably even smaller. Additionally, the temperature level was raised from 85 to 105° C. with no appreciable change in module resistance. This is completely surprising in light of the disclosure of WO 97/13283 which stated that modules utilizing tin-containing solders were not considered to be serviceable at temperatures above 80° C.

EXAMPLE 2

FIG. 3 illustrates the test results for a different module utilizing pellets having a dimension of 1.0 mm×1.0 mm×1.27 mm tall. This module also had 127 couples, 254 pellets and 508 solder junctions. The composition of the semiconductor elements and the solder was the same as in Example 1.

The illustrated test was an accelerated dynamic thermal test run for over 300 hours. The hot side of the module was kept at 205° C. and the cold side at 60° C. This test was performed to evaluate the same degradation phenomenon as in Example 1 with the added benefit of having the current flowing in the system and to have a hot and cold side at a high temperature difference to cause deformation stresses on the solder junctions and therefore test for the solder joint mechanical strength. The test was also performed in free air. As illustrated in FIG. 3, the module resistance was unchanged, which indicated that there was no adverse effect of solder degradation.

EXAMPLE 3

In order to evaluate the wettability of the solder compositions of the present invention and comparative solder compositions to semiconductor elements, a series of solder wettability tests were run. Comparative solder alloys corresponding to those used in industry detailed in the prior art were evaluated along with three solder compositions falling within the scope of the present claims. The tests were run by taking ten pellets composed of five P-type and five N-type semiconductor materials to evaluate the wettability thereof. As shown in the below table, the comparative $Sn_{63}Pb_{37}$ solder composition, having a melting point of 183° C., failed to wet any of the bare pellets. The comparative $Sn_{95}Sb_5$ solder compositions, having a melting point of 240° C., did manage to wet all ten of the pellets but the wetting was inconsistent with major voids formed on three of the ten semiconductor pellets and minor voids formed on two of the ten semiconductor pellets and therefore was not acceptable.

TABLE

| Solder Composition (M.P.) | Wetting Performance | Comments |
| --- | --- | --- |
| $Sn_{63}Pb_{37}$ Eutectic (183° C.) | 0/10 | No wetting on bare pellets. |
| $Sn_{95}Sb_5$ Eutectic (240° C.) | 10/10 | Wetting is inconsistent, major voids on 3/10, minor voids on 2/10. Not acceptable. |
| $Bi_{70}Sn_{20}Sb_{10}$ Eutectic (260° C.) | 10/10 | Good wetting on all pellets. |
| $Bi_{50}Sn_{26}Sb_{30}$ Eutectic (384° C.) | 10/10 | Good wetting. Some minor voids (1–3% surface). |
| $Bi_{20}Sn_{40}Sb_{40}$ Eutectic (392° C.) | 10/10 | Good wetting. |

In contrast to the comparative solder compositions, the solder compositions of the present invention all had a much higher melting point and wetted all of the semiconductor pellets. As such, the solder composition of the present invention can be bonded directly with the semiconductor elements and, due to the components making up the inventive solder compositions, attendant contamination does not occur. This eliminates the need for a barrier layer to separate the thermoelectric material from the solder. The elimination of the barrier layer reduces the manufacturing time and cost and improves the reliability of the module. Moreover, since this solder composition allows for the thermoelectric modules to be used in a higher temperature service, more cost effective use of the thermoelectric modules can be made.

The embodiments of the invention in which an exclusive property or privilege is claimed are defined as follows:

1. A thermoelectric module comprising a conductor, a metallized layer formed on a surface of the conductor and a P-type semiconductor element and an N-type semiconductor element electrically connected in series to each other in a circuit containing a solder layer and the conductor, in which the improvement comprises said solder layer being formed from a ternary eutectic alloy composition containing Bi in an amount of from 5 to 70 atomic %, Sn in an amount of from 20 to 80 atomic % and Sb in an amount of from 10 to 70 atomic %.

2. The thermoelectric module of claim 1, wherein the solder contains Bi in an amount of from 10 to 70 atomic % and Sn in an amount of from 20 to 40 atomic %.

3. The thermoelectric module of claim 1, wherein the solder contains Bi in an amount of from 20 to 70 atomic %, Sn in an amount of from 20 to 40 atomic % and Sb in an amount of from 10 to 40 atomic %.

4. The thermoelectric module of claim 1, wherein the solder contains Bi in an amount of 70 atomic %, Sn in an amount of 20 atomic % and Sb in an amount of 10 atomic %.

5. The thermoelectric module of claim 1, wherein the solder contains Bi in an amount of 50 atomic %, Sn in an amount of 20 atomic % and Sb in an amount of 30 atomic %.

6. The thermoelectric module of claim 1, wherein the solder contains Bi in an amount of 20 atomic %, Sn in an amount of 40 atomic % and Sb in an amount of 40 atomic %.

7. The thermoelectric module of claim 1, wherein the solder contains Bi in an amount of 60 atomic %, Sn in an amount of 20 atomic % and Sb in an amount of 20 atomic %.

8. The thermoelectric module of claim 1, wherein the solder directly contacts the semiconductor elements.

9. The thermoelectric module of claim 1, wherein a barrier layer is provided between the solder and the semiconductor elements.

10. The thermoelectric module of claim 1, wherein the P-type semiconductor element comprises bismuth, antimony and tellurium.

11. The thermoelectric module of claim 1, wherein the N-type semiconductor element comprises bismuth, tellurium, selenium and, optionally, antimony.

12. The thermoelectric module of claim 1, wherein the P-type semiconductor element is pressed and sintered.

13. The thermoelectric module of claim 1, wherein the N-type semiconductor element is crystalline.

14. The thermoelectric module of claim 1, wherein the conductor comprises copper.

15. The thermoelectric module of claim 1, wherein the metallized layer comprises nickel.

16. In a method of fabricating a thermoelectric module comprising a step of electrically connecting a P-type semiconductor element and N-type semiconductor element in series in a circuit containing a solder layer and a conductor having a metallized layer formed on a surface thereof, the improvement comprises said solder layer being formed from a ternary eutectic composition containing Bi in an amount of from 5 to 70 atomic %, Sn in an amount of from 20 to 80 atomic % and Sb in an amount of from 10 to 70 atomic %.

17. The method of claim 16, wherein the solder contains Bi in an amount of from 10 to 70 atomic % and Sn in an amount of from 20 to 40 atomic %.

18. The method of claim 16, wherein the solder contains Bi in an amount of 20 to 70 atomic %, Sn in an amount of from 20 to 40 atomic % and Sb in an amount of from 10 to 40 atomic %.

19. The method of claim 16, wherein the solder contains Bi in an amount of 70 atomic %, Sn in an amount of 20 atomic % and Sb in an amount of 10 atomic %.

20. The method of claim 16, wherein the solder contains Bi in an amount of 50 atomic %, Sn in an amount of 20 atomic % and Sb in an amount of 30 atomic %.

21. The method of claim 16, wherein the solder contains Bi in an amount of 20 atomic %, Sn in an amount of 40 atomic % and Sb in an amount of 40 atomic %.

22. The method of claim 16 wherein the solder contains Bi in an amount of 60 atomic %, Sn of 20 atomic % and Sb in an amount of 20 atomic %.

23. The method of claim 16, additionally comprising the step of directly contacting semiconductor elements with the solder.

24. The method of claim 16, additionally comprising the step of providing a barrier layer between the solder and the semiconductor elements.

25. The method of claim 16, wherein the P-type semiconductor element comprises bismuth, antimony and tellurium.

26. The method of claim 16, wherein the N-type semiconductor element comprises bismuth, tellurium, selenium and, optionally, antimony.

27. The method of claim 16, wherein the P-type semiconductor element is pressed and sintered.

28. The method of claim 16, wherein the N-type semiconductor element is crystalline.

29. The method of claim 16, wherein the conductor comprises copper.

30. The method of claim 16, wherein the metallized layer comprises nickel.

* * * * *